United States Patent
Jouanneau

(10) Patent No.: US 11,996,849 B2
(45) Date of Patent: May 28, 2024

(54) TIMING SEQUENCE GENERATION CIRCUIT

(71) Applicant: STMicroelectronics (Alps) SAS, Grenoble (FR)

(72) Inventor: Thomas Jouanneau, ST-Egreve (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 18/176,753

(22) Filed: Mar. 1, 2023

(65) Prior Publication Data

US 2023/0291395 A1    Sep. 14, 2023

(30) Foreign Application Priority Data

Mar. 14, 2022   (FR) ...................................... 2202203

(51) Int. Cl.
*H03K 5/15*     (2006.01)
*H03L 7/099*   (2006.01)

(52) U.S. Cl.
CPC ..... *H03K 5/15066* (2013.01); *H03K 5/15093* (2013.01); *H03L 7/0996* (2013.01)

(58) Field of Classification Search
CPC .......... H03K 5/15066; H03K 5/15093; H03K 3/0315; H03L 7/0996; G06F 1/04
USPC ...................................................... 327/295
See application file for complete search history.

(56) References Cited

U.S. PATENT DOCUMENTS

| | | | | |
|---|---|---|---|---|
| 5,751,775 A | * | 5/1998 | Fensch | H04Q 11/0435 375/376 |
| 5,889,436 A | * | 3/1999 | Yeung | H03L 7/081 331/25 |
| 5,994,933 A | * | 11/1999 | Yamanaka | H03L 7/081 327/158 |
| 6,418,176 B1 | * | 7/2002 | Ho | H04L 7/005 375/372 |
| 6,421,789 B1 | * | 7/2002 | Ooishi | G11C 29/14 714/6.32 |
| 6,542,013 B1 | * | 4/2003 | Volk | H03L 7/1974 327/117 |
| 6,788,161 B2 | | 9/2004 | Vilander | |
| 6,958,633 B2 | * | 10/2005 | Chien | H03K 23/68 327/115 |
| 7,113,011 B2 | * | 9/2006 | Leung | H03K 7/08 327/158 |
| 7,116,144 B1 | * | 10/2006 | Cheng | H03L 7/081 327/156 |

(Continued)

FOREIGN PATENT DOCUMENTS

EP    0680170 A1    11/1995
EP    1772794 A1    4/2007

*Primary Examiner* — Ryan Jager
(74) *Attorney, Agent, or Firm* — Slater Matsil, LLP

(57) ABSTRACT

In accordance with an embodiment, a timing sequence generation circuit includes: a ring oscillator having a plurality of clock signal outputs configured to provide clock signals delayed in time with respect to one another; a first shift register comprising a flip-flop having a clock input coupled to a clock signal input of the first shift register and an output coupled to an output of the first shift register; and a first circuit configured to: select a clock signal from among the clock signals; and deliver the selected clock signal to the clock signal input of the first shift register

21 Claims, 10 Drawing Sheets

(56) References Cited

U.S. PATENT DOCUMENTS

| | | | | |
|---|---|---|---|---|
| 7,791,387 B1* | 9/2010 | Wong | ................... | H03M 1/0639 |
| | | | | 327/172 |
| 7,852,168 B1 | 12/2010 | Song et al. | | |
| 8,378,719 B1* | 2/2013 | Pace | ...................... | H03K 23/66 |
| | | | | 327/117 |
| 8,653,862 B2* | 2/2014 | Lin | ......................... | H03L 7/197 |
| | | | | 327/117 |
| 8,675,812 B1* | 3/2014 | Warner | ............... | G06F 13/4291 |
| | | | | 377/67 |
| 9,112,516 B2* | 8/2015 | Kushiyama | ............... | G11C 7/22 |
| 10,218,336 B2 | 2/2019 | La Rosa | | |
| 11,443,073 B2* | 9/2022 | Koay | ................... | H03K 3/0315 |
| 2003/0190006 A1* | 10/2003 | Nagano | ................. | H03L 7/0995 |
| | | | | 375/376 |
| 2005/0280458 A1* | 12/2005 | Leung | ............... | H02M 3/33576 |
| | | | | 327/172 |
| 2006/0159157 A1* | 7/2006 | Seibold | ................ | H03L 7/0996 |
| | | | | 375/376 |
| 2007/0162155 A1* | 7/2007 | Zucker | .................. | G06F 13/385 |
| | | | | 700/1 |
| 2008/0192563 A1* | 8/2008 | Cho | .................... | G11C 11/4076 |
| | | | | 365/233.17 |
| 2009/0261880 A1* | 10/2009 | Nagashima | ......... | H04L 25/0288 |
| | | | | 327/306 |
| 2012/0256693 A1 | 10/2012 | Raghunathan et al. | | |
| 2013/0093526 A1 | 4/2013 | Ravinuthula | | |
| 2023/0291395 A1* | 9/2023 | Jouanneau | ......... | H03K 5/15066 |
| | | | | 327/295 |

\* cited by examiner

US 11,996,849 B2

TIMING SEQUENCE GENERATION CIRCUIT

CROSS-REFERENCE TO RELATED APPLICATIONS

This application is a translation of and claims the priority benefit of French patent application number FR2202203, filed on Mar. 14, 2022, which is hereby incorporated by reference

TECHNICAL FIELD

The present disclosure generally concerns electronic digital time signal generation circuits.

BACKGROUND

Many types of devices, such as memories or calculators, require digital signals with given timing sequences to control actions, to be performed by these devices and at specific times. The generation of these timing sequences with a time scale in the order of a few hundreds of picoseconds currently requires using microprocessors having an operating frequency of a plurality of GHz. These microprocessors generally use phase-lock loops at high frequencies, which implies using advanced technologies as well as high manufacturing costs and a high power consumption. It is further currently difficult to generate adjustable timing sequences without implying a significant development complexity.

SUMMARY

An embodiment provides a timing sequence generation circuit comprising: a ring oscillator comprising a plurality of logic gates, coupled in series, each logic gate outputting a clock signal, the clock signals being delayed in time with respect to one another; a first shift register comprising: a clock signal input, the register comprising a flip-flop, or a plurality of series-coupled flip-flops, the clock signal input being coupled to the clock input of the flip-flop(s), and an output delivering the output signal of the flip-flop or outputs each delivering the output signal of each of the flip-flops; a first device configured to: select one among the clock signals of the logic gates, and deliver the selected clock signal CK(i) to the input of the clock signal of the shift register.

An embodiment provides a method of generating a timing sequence of a circuit comprising: a ring oscillator comprising a plurality of logic gates, coupled in series, each logic gate outputting a clock signal, the clock signals being delayed in time with respect to one another; a first shift register comprising: a clock signal input, the register comprising a flip-flop, or a plurality of series-coupled flip-flops, the clock signal input being coupled to the clock input of the flip-flop(s), and an output delivering the output signal of the flip-flop or outputs each delivering the output signal of each of the flip-flops. The method comprises selecting one among the clock signals of the logic gates, and delivering the selected clock signal to the clock signal input of the shift register.

According to an embodiment, the circuit or the method further comprises a second device configured to select the output signal of the flip-flop, or one from among the output signals of the flip-flops. According to an embodiment, the flip-flop(s) are of type D. According to an embodiment, a second shift register comprises a flip-flop, or a plurality of series-coupled flip-flops having their clock input configured to receive another clock signal selected from among the clock signals of the logic gates.

According to an embodiment, the reset input of the flip-flop, or of at least one among the plurality of flip-flops of the second shift register, is coupled to an output signal of the first register among the output signal of the flip-flop or of one of the flip-flops of the first shift register.

According to an embodiment, the second shift register comprises a plurality of the flip-flops, and the data input of at least one of the flip-flops of the second shift register is configured to receive a signal selected by a multiplexer from among a signal corresponding to a high level or the output signal of one of the other flip-flops of the second shift register.

According to an embodiment, the data input of the flip-flop or of at least one among the plurality of flip-flops of the second shift register, is configured to receive the output signal of the flip-flop or of one of the flip-flops of the first shift register.

According to an embodiment, the second shift register comprises a plurality of the flip-flops, and the clock signal, selected for the clock input of one of the flip-flops of the second shift register, is different from the clock signal selected for the clock input of another one of the flip-flops of the second shift register.

According to an embodiment, the shift register further comprises: a first selection device having a first input coupled to the output of a first flip-flop of the shift register and a second input coupled to a power supply rail, and configured to couple a selected one among these first and second inputs to the input of a second flip-flop of the shift register; and a second selection device having a first input coupled to the output of the second flip-flop of the shift register and a second input coupled to a power supply rail, and configured to couple a selected one among these first and second inputs to the input of a third flip-flop of the shift register.

According to an embodiment, the number of logic gates is an odd number.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Some embodiments are directed to a timing sequence generation circuit. In some embodiments, the timing sequence generation circuit is advantageously easy to adjust, may be manufactured with moderate costs, and/or may limit the electric power consumption.

Figure 1:
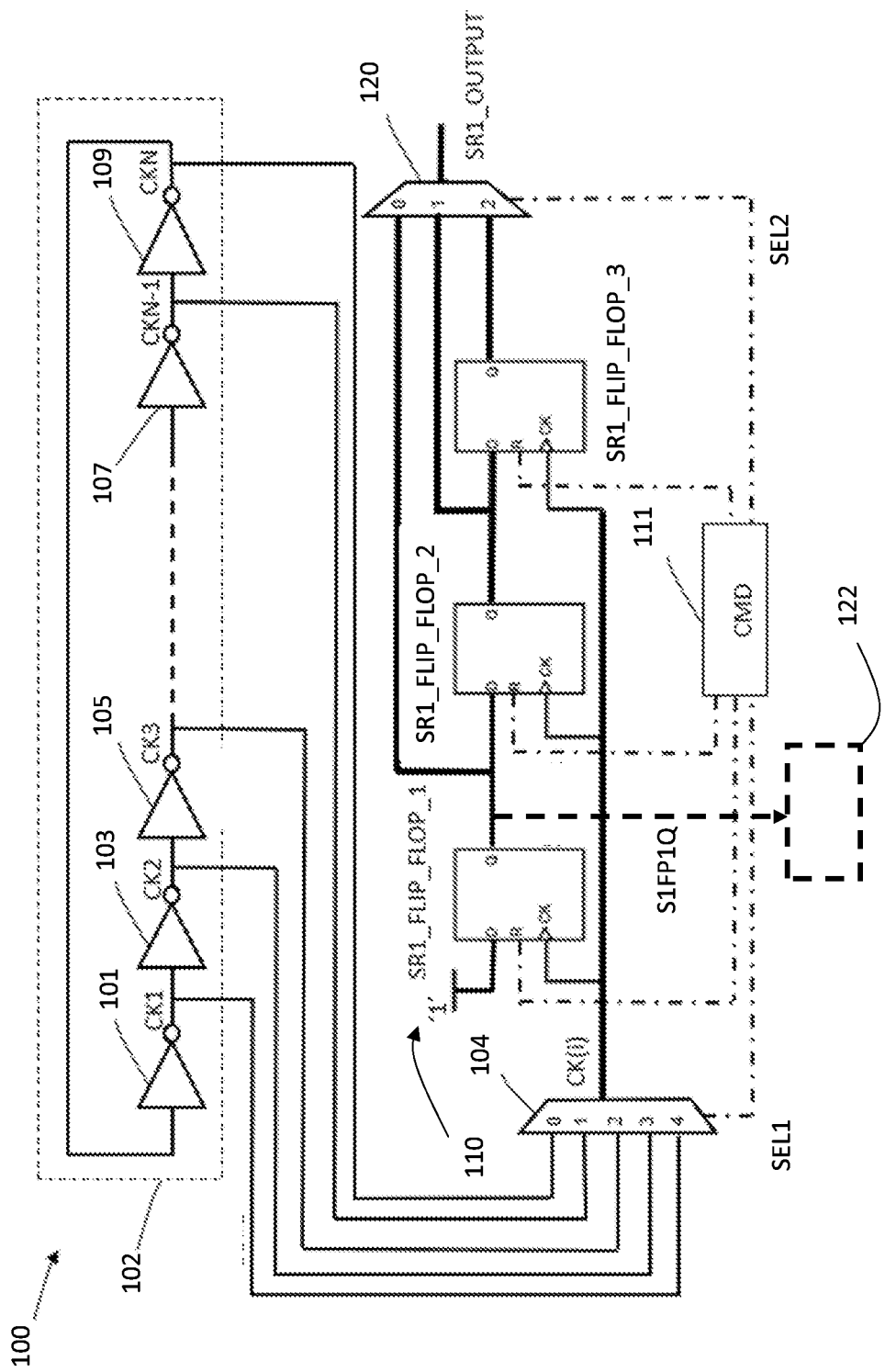
FIG. 1 schematically shows a circuit for generating an edge of a timing sequence according to an embodiment of the present disclosure.

FIG. 1 schematically shows a circuit 100 for generating an edge of a timing sequence according to an embodiment of the present disclosure.

According to the example of FIG. 1, timing sequence generation circuit 100 comprises a ring oscillator 102. Ring oscillator 102 is formed of a plurality of logic gates 101, 103, 105, 107, 109 coupled in series and to the output of logic gate 109 coupled to the input of logic gate 101, and having their respective output node called CK1, CK2, CK3, CKN−1, CKN. By using number N, which represents the number of logic gates of the oscillator, those skilled in the art will be able to adjust their calculations according to the number of gates. As in the example of FIG. 1, the logic gates are for example inverters. It is however possible for oscillator 102 to be formed based on other types of logic gates, such as NOR gates or NAND gates.

Oscillator 102 is implemented, for example, by a loop formed of an odd number of logic gates. Even if in the example of FIG. 1, 5 gates are illustrated, it is for example possible for the oscillator to be implemented by 3 logic gates or also by an odd number of logic gates greater than 5. Each logic gate outputs a clock signal: CK1, CK2, CK3, CKN−1, and CKN.

Output logic signals CK1 to CKN have edges exhibiting time delays with respect to one another, and by selecting one among these signals, it is thus possible to generate an edge with a given time delay.

Clock signals CK1, CK2, CK3, CKN−1, and CKN are for example coupled to the input of a multiplexer 104 configured to select one or a plurality of signal from among these clock signals. Multiplexer 104 is controlled by a selection signal SEL1 generated by a control unit CMD, 111. The output of multiplexer 104 supplies a clock signal input of a first shift register 110 with a clock signal CK(i) selected from among clock signals CK1 to CKN.

According to the example of FIG. 1, first shift register 110 comprises three series-coupled flip-flops SR1_FLIP_FLOP_1, SR1_FLIP_FLOP_2, SR1_FLIP_FLOP_3. It is however possible to envisage, according to the desired time delay, for shift register 110 to comprise a single flip-flop or two flip-flops or a number of series-coupled flip-flops greater than three. In the example of FIG. 1, the flip-flops are for example of type D. In the rest of the description, examples are described where the flip-flops are activated by rising edges. However, those skilled in the art will be capable of adapting the teachings of the disclosure for flip-flops activated by falling edges. By the terms "series-coupled", there should be understood that the output of a flip-flop, noted Q, is coupled to the data input, noted D, of the next flip-flop in the series. Those skilled in the art will also be capable of adapting the circuit by considering a $\overline{Q}$ output of the flip-flops. The D data input of the first flip-flop in the series SR1_FLIP_FLOP_1 is for example supplied with a voltage in the high state, noted 1.

The clock signal input of the first shift register 110 is coupled, for example, to the clock input, noted CK, of each of the flip-flops in the series.

The output signal of each of the flip-flops is for example coupled to a multiplexer 120 which enables to select one from among the Q output signals of the flip-flops to form an output signal SR1_OUTPUT of shift register 110. In the example of FIG. 1, the rising edge of the output signal selected by multiplexer 120 forms the rising edge of the timing sequence to be obtained. Multiplexer 120 is for example controlled by a signal SEL2 generated by control unit CMD. This enables to generate easily-adjustable timing sequences. In other embodiments, multiplexer 120 is omitted.

In certain embodiments, the output signal of the first flip-flop, noted S1FP1Q, is directed towards a secondary circuit 122.

The reset inputs (RESET), noted R, of each of flip-flops SR1_FLIP_FLOP_1, SR1_FLIP_FLOP_2, SR1_FLIP_FLOP_3 are for example controlled by control unit CMD. Control unit CMD is for example configured to control these reset inputs so that the resetting of the flip-flops is performed before the starting of the timing sequence generation cycle.

The selection of one of the clock signals with the multiplexer 104 of the circuit of FIG. 1 enables to generate an edge in a time range equal or close to the edge of the timing sequence to be obtained. Complementarily, the edge generated with the selection of the clock signal desired by multiplexer 104 may potentially be delayed by a number of clock periods at most equal to the number of flip-flops of first shift register 110. The number of flip-flops will thus be implemented according to the duration of the desired timing sequence. In certain embodiments, within a device, a plurality of timing sequence edge generation circuits 100 are for example implemented, each with a number of flip-flops of the first register which is the same or which is different for at least some of the circuits with respect to the others, the number of flip-flops being for example selected to be equal to a maximum edge delay. Multiplexers 104 and/or 120 enable to program this delay to generate timing sequences of different duration.

The circuit 100 of FIG. 1 enables the generation of a timing sequence with an edge using a smaller number of flip-flops as compared with other solutions. The power per surface area unit ratio may be decreased by more than half with respect to existing solutions. Further, the example of FIG. 1 enable the design to be implemented in a manner that does not exponentially increase the design complexity with the duration of the timing sequence to be generated. Indeed, generating an edge of the timing sequence with an additional delay may be performed by adding an additional circuit 100 with a number of flip-flops selected according to the desired time delay.

Figure 2:
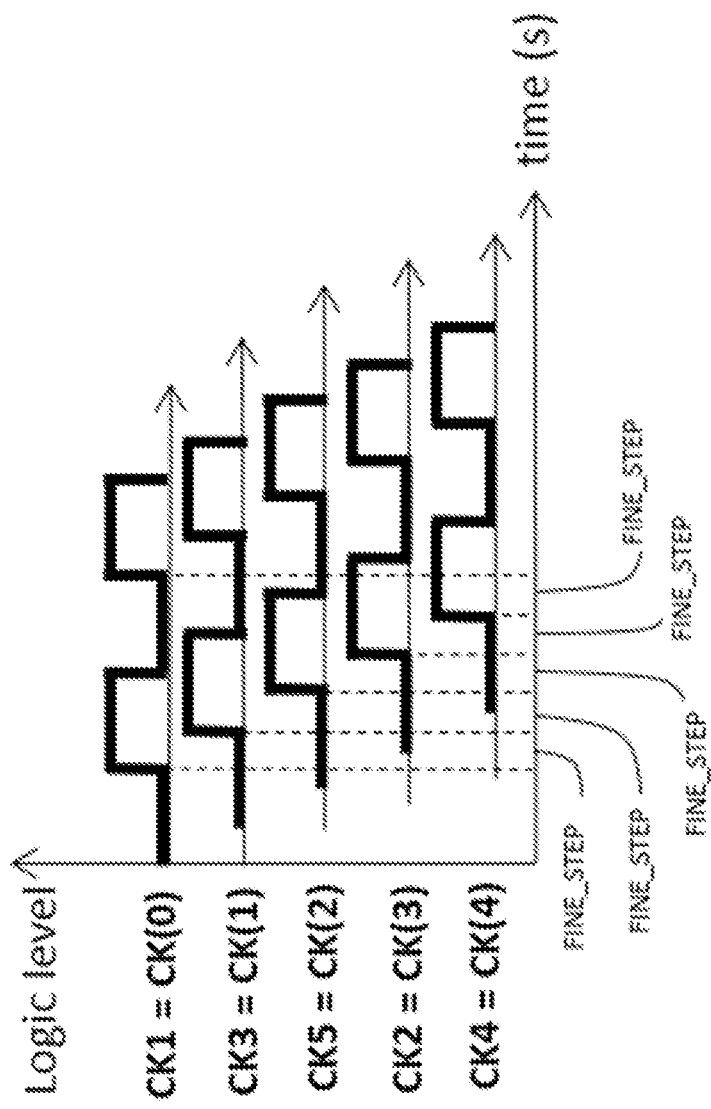
FIG. 2 is a timing diagram showing clock signals of an oscillator of the circuit of FIG. 1.

FIG. 2 is a timing diagram showing an example of the clock signals of the oscillator 102 of the circuit of FIG. 1. More particularly, in FIG. 2, the shown signals are those having their rising edge delayed in time between each clock signal according to a time step FINE_STEP, equal to the propagation time of two logic gates of the ring oscillator. The clock signals which are delayed with respect to one another in the order are for example renamed CK(0), CK(1), CK(2), CK(3), and CK(4).

Table 1 illustrates how, based on clock signals CK1, CK2, CK3, CKN−1, and CKN, the order of the clock signals is determined.

TABLE 1

| Clock signal | CK1 | CK3 | CKN | CK2 | CKN − 1 |
|---|---|---|---|---|---|
| Signals delayed in the order and renamed | CK(0) | CK(1) | CK(0.5*(N − 1)) | CK(0.5*(N − 1) + 1) | CK(N − 1) |

According to the example of FIG. 2, which corresponds to an example with five logic gates and as calculated based on Table 1, the clock signals which are delayed in the order corresponding to CK(0)=CK1, CK(1)=CK3, CK(2)=CK5, CK(3)=CK2, CK(4)=CK4.

Figure 3:
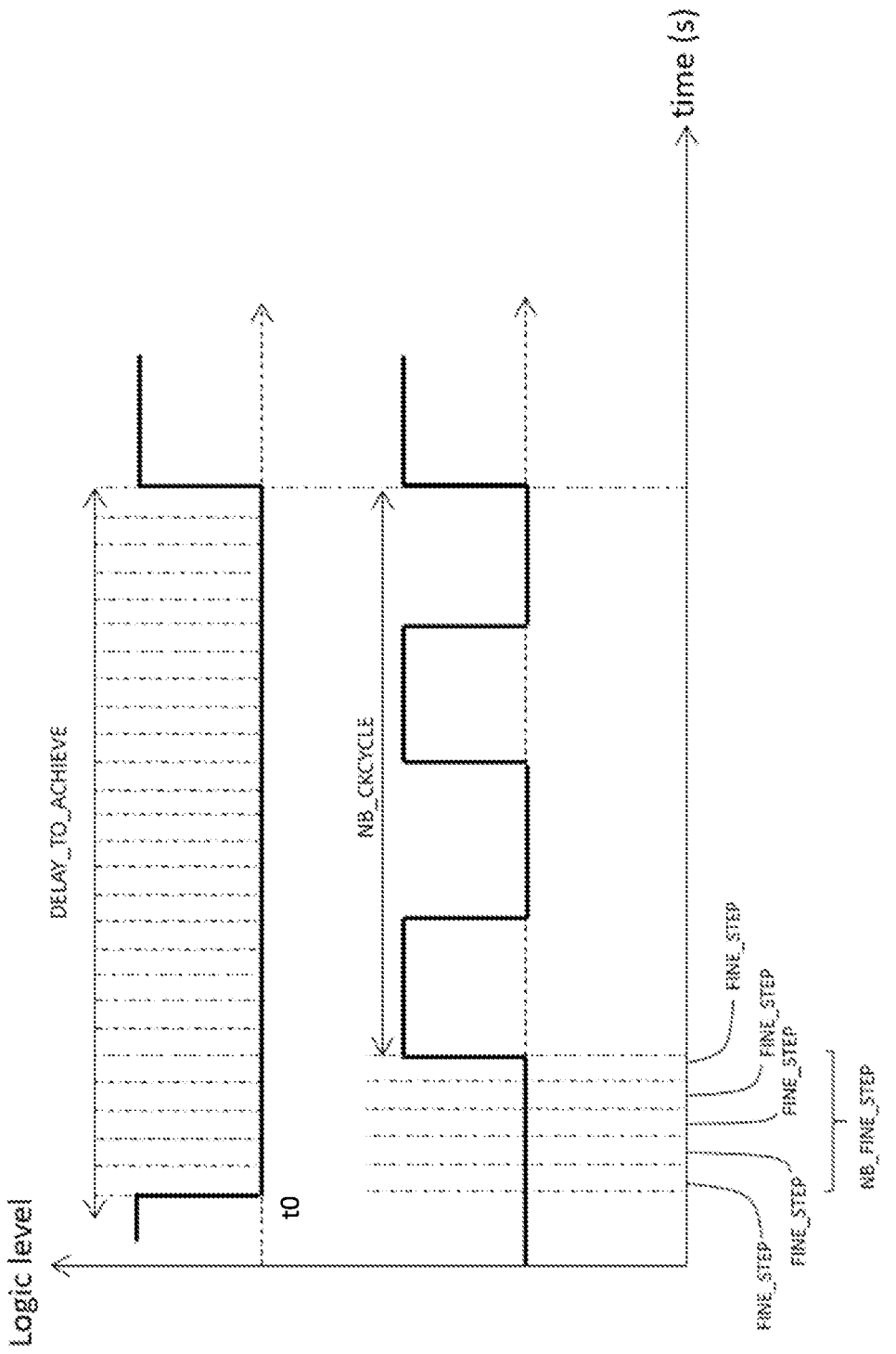
FIG. 3 is a timing diagram showing an edge of a timing sequence obtained with the circuit of FIG. 1, and the construction in further detail of this edge according to an embodiment of the present disclosure.

FIG. 3 is a timing diagram showing the generation of an edge of a timing sequence obtained with the circuit of FIG. 1, and the construction in further detail of this edge according to an embodiment of the present disclosure.

To determine the selection to be performed by the multiplexers 104 and 120 of FIG. 1 to generate an edge of a given timing sequence, two parameters, for example are determined.

It is considered that a timing sequence starts at a time to, and that an edge to be generated is delayed with respect to time to by a time delay DELAY_TO_ACHIEVE.

A first parameter is the integer number of clock cycles NB_CKCYCLE comprised between time to and the edge of the timing sequence to be generated. Parameter NB_CKCYCLE depends on the number of time steps FINE_STEP of the oscillator forming time delay DELAY_TO_ACHIEVE. To convert time delay DELAY_TO_ACHIEVE, expressed in seconds, into a time delay expressed in number of time steps FINE_STEP, the time delay DELAY_TO_ACHIEVE expressed in seconds is multiplied by the number of logic gates of oscillator 102 and by the frequency of the oscillator expressed in seconds$^{-1}$. Parameter NB_CKCYCLE is, for example, calculated by taking the integer portion of the ratio of the time delay DELAY_TO_ACHIEVE expressed in number of equal time steps to the number of logic gates of the oscillator.

A second parameter is the number NB_FINE_STEP of time steps FINE_STEP of the oscillator which, added to NB_CKCYCLE, is equal or approximately equal to time delay DELAY_TO_ACHIEVE. For example, number NB_FINE_STEP is selected as being that which corresponds to a time delay closest to time delay DELAY_TO_ACHIEVE. Parameter NB_FINE_STEP is for example determined by taking time delay DELAY_TO_ACHIEVE, expressed in number of time steps FINE_STEP, modulo the number N of logic gates of oscillator 102.

Once these parameters have been determined, for example, by a calculator, multiplexer 104 selects as an output the clock signal with CK(i)=CK(NB_FINE_STEP). Multiplexer 120 selects the output signal of one of the flip-flops which corresponds to NB_CKCYCLE, for example, the output of flip-flop SR1_FLIP_FLOP_1 if NB_CKCYCLE=0, SR1_FLIP_FLOP_2 if NB_CKCYCLE=1, SR1_FLIP_FLOP_3 if NB_CKCYCLE=2 etc.

In the example of FIG. 3, the number of logic gates is equal to 5, the number of flip-flops is equal to 3, multiplexer 104 has 5 inputs, multiplexer 120 has 3 inputs, and the number of time steps that may be used to delay the edge by the delay to be achieved is equal at most to 5. According to the control of the two multiplexers 104, 120, the edge of the delay to be achieved may thus be generated between the value of a time step up to 5 time steps added to 2 clock periods. The higher the number of flip-flops, the more it is possible to delay the edge in addition to the edge of the clock signal selected by multiplexer 104. In alternative embodiments, the number logic gates, flip-flops and multiplexer inputs may be different according to the particular embodiment and its specifications.

Figure 4:
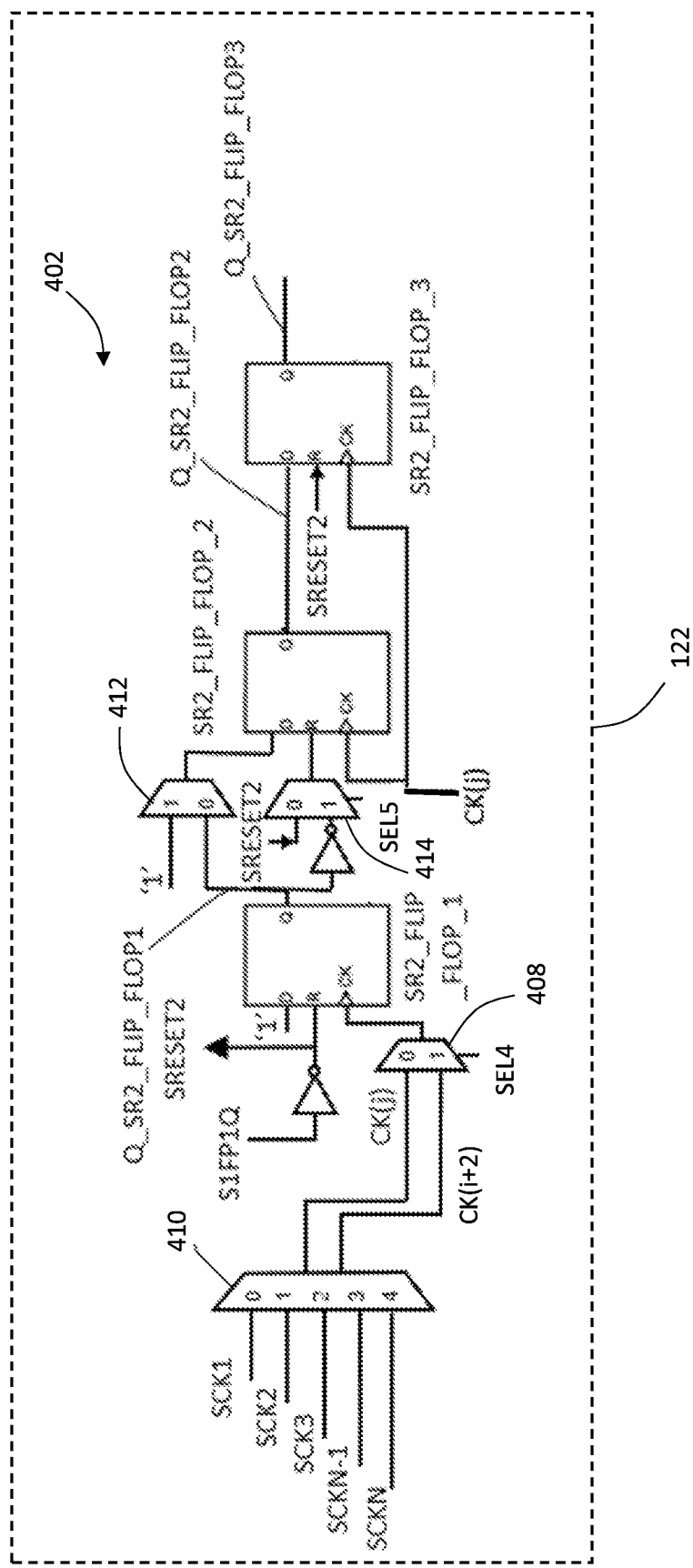
FIG. 4 schematically shows in detail a secondary timing sequence edge generation circuit according to an embodiment of the present disclosure.

FIG. 4 schematically shows in detail the secondary circuit 122 of the circuit 100 of FIG. 1 according to an embodiment of the present disclosure. Secondary circuit 122 enables the generation of a second edge of the timing sequence at a desired time with respect to the edge generated by circuit 100.

According to the example of FIG. 4, secondary circuit 122 comprises a second additional shift register 402 comprising one or a plurality of flip-flops, for example, of type D, which are three SR2_FLIP_FLOP_1, SR2_FLIP_FLOP_2, and SR2_FLIP_FLOP_3 in the example of FIG. 4. The D input of flip-flop SR2_FLIP_FLOP1 is for example pulled to a power supply voltage corresponding to high state 1. According to the example of FIG. 4, an inverter is arranged between the output S1FP1Q of the flip-flop SR1_FLIP_FLOP_1 of FIG. 1 and the R input of flip-flop SR2_FLIP_FLOP_1. The signal thus obtained at the R input of flip-flop SR2_FLIP_FLOP_1 is called SRESET2.

According to the example of FIG. 4, a selection device 410 of secondary circuit 122 receives as an input the clock signals generated by the ring oscillator. In the example with 5 logic gates of FIG. 1, these clock signals are the 5 signals CK1, CK2, CK3, CK4, and CK5. More generally, these clock signals are the N signals CK1 to CKN. Selection device 410 is for example formed of one or a plurality of multiplexers. Selection device 410 is configured to select, for example, two different clock signals CK(i+2) and CK(j). Index i corresponds, for example, to that of the clock signal selected by the multiplexer 104 of FIG. 1. Index j is determined, for example, with a calculator, according to the time delay DELAY_TO_ACHIEVE2 to be achieved by secondary circuit 122, in particular, the delay desired between the first edge generated by the circuit 100 of FIG. 1, and the additional edge to be generated by secondary circuit 122. Index j is determined, for example, by adding number NB_FINE_STEP2 to i, where NB_FINE_STEP2 is selected as being that which corresponds to a time delay closest to time delay DELAY_TO_ACHIEVE2. Then, the result of this addition is taken modulo the number N of logic gates of oscillator 102.

The clock input of flip-flop SR2_FLIP_FLOP1 is coupled to the output of a multiplexer 408. Multiplexer 408 is, for example, configured to be controlled by a selection signal SEL3 generated by the control unit CMD of FIG. 1 to select one of the clock signals from among CK(i+2) and CK(j). The selected clock signal is delivered to the clock input, for example, of flip-flop SR2_FLIP_FLOP_1.

The clock input of the other flip-flops of the second shift register receives, for example, clock signal CK(j).

According to the example of FIG. 4, the data input of flip-flop SR2_FLIP_FLOP2 is coupled to the output of a multiplexer 412 configured to select a signal from among a voltage of high level "1" or the output of flip-flop SR2_FLIP_FLOP1. Multiplexer 412 is configured to be controlled by a selection signal SEL4 generated by the control unit CMD of FIG. 1.

The reset input R of flip-flop SR2_FLIP_FLOP_2 is coupled to a multiplexer 414, controlled by a signal SEL generated by control unit CMD, 111, configured to select a signal from among signal SRESET2 or the signal complementary to the output of flip-flop SR2_FLIP_FLOP_1 noted Q_SR2_FLIP_FLOP_1. The signal complementary to the output of flip-flop SR2_FLIP_FLOP1 is for example generated by an inverter which couples the output of flip-flop SR2_FLIP_FLOP1 to the input of multiplexer 414.

The output of flip-flop SR2_FLIP_FLOP_2, noted Q_SR2_FLIP_FLOP_2, is for example coupled to the D data input of flip-flop SR2_FLIP_FLOP_3.

The reset input of flip-flop SR2_FLIP_FLOP_3 receives, for example, signal SRESET2.

An additional multiplexer, similar to multiplexer 120 and not illustrated in FIG. 4, may be added in secondary circuit 122 to the outputs of flip-flops SR2_FLIP_FLOP_1, SR2_FLIP_FLOP_2, and SR2_FLIP_FLOP_3. This multiplexer may be controlled to select as an output either signal Q_FLIP_FLOP1 or signal Q_FLIP_FLOP2 or signal Q_FLIP_FLOP3 to be able to delay the second edge of the timing sequence with respect to signal CK(j) or CK(i+2).

In an example, not illustrated, selection devices 408 and 410 may be combined to form a single multiplexer, the control signal of which will be generated by control unit 111 according to the relative values of i and j such as described in the following paragraphs.

According to the example of FIG. 4, the first edge of the desired timing sequence is obtained with the selection of CK(i) in the same way as according to the example of FIG. 1. The value complementary to the selected signal CK(i), that is, signal S1FP1Q in the example of FIG. 4, is used to reset second shift register 402, which is used to generate the second edge generated from CK(j) and which forms the timing sequence. The second edge is obtained similarly to the first edge, but from CK(j), possibly delayed by NB_FIN-E_STEP by the selection of the corresponding flip-flop in second shift register 402 similarly to the first shift register.

In certain cases, multiplexer 408 is controlled to perform the selection of signal CK(i+2) instead of CK(j), for example, only when j=i or j=i+1. When j is different from j=i or j=i+1, multiplexer 408 is controlled to perform the selection of signal CK(j).

In certain cases, multiplexer 412 is controlled, for example, to select the voltage of high state "1" when j=i or j=i+1 or select, for example, signal Q_FLIP_FLOP2 when j is different from i and from i+1.

In certain cases, multiplexer 414 is controlled to select signal SRESET2 when j is different from i or to select, for example, the signal inverse to output Q_FLIP_FLOP2 when j=i.

The selections performed by multiplexers 408, 412 or 414 when j=i or j=i+1 enable to avoid functional risks if the delay introduced by the operation of the flip-flops and/or of the multiplexers and/or of the logic gates are close to the value of parameter FINE_STEP.

In certain cases, the number of logic gates of oscillator 102 is equal to or greater than 5, and the duration between the two edges of the timing sequence is at least 2 FIN-E_STEP and the number NB_FINE_STEP selected for the first edge implies that the output of flip-flop Q_SR2_FLIP_FLOP_X, which would be selected at the level of the second shift register, is at zero. In these cases, the flip-flop selected at the level of the second shift register is for example the next flip-flop Q_SR2_FLIP_FLOP_X+1. This helps avoid functional problems due to the high frequencies used.

Figure 5A:
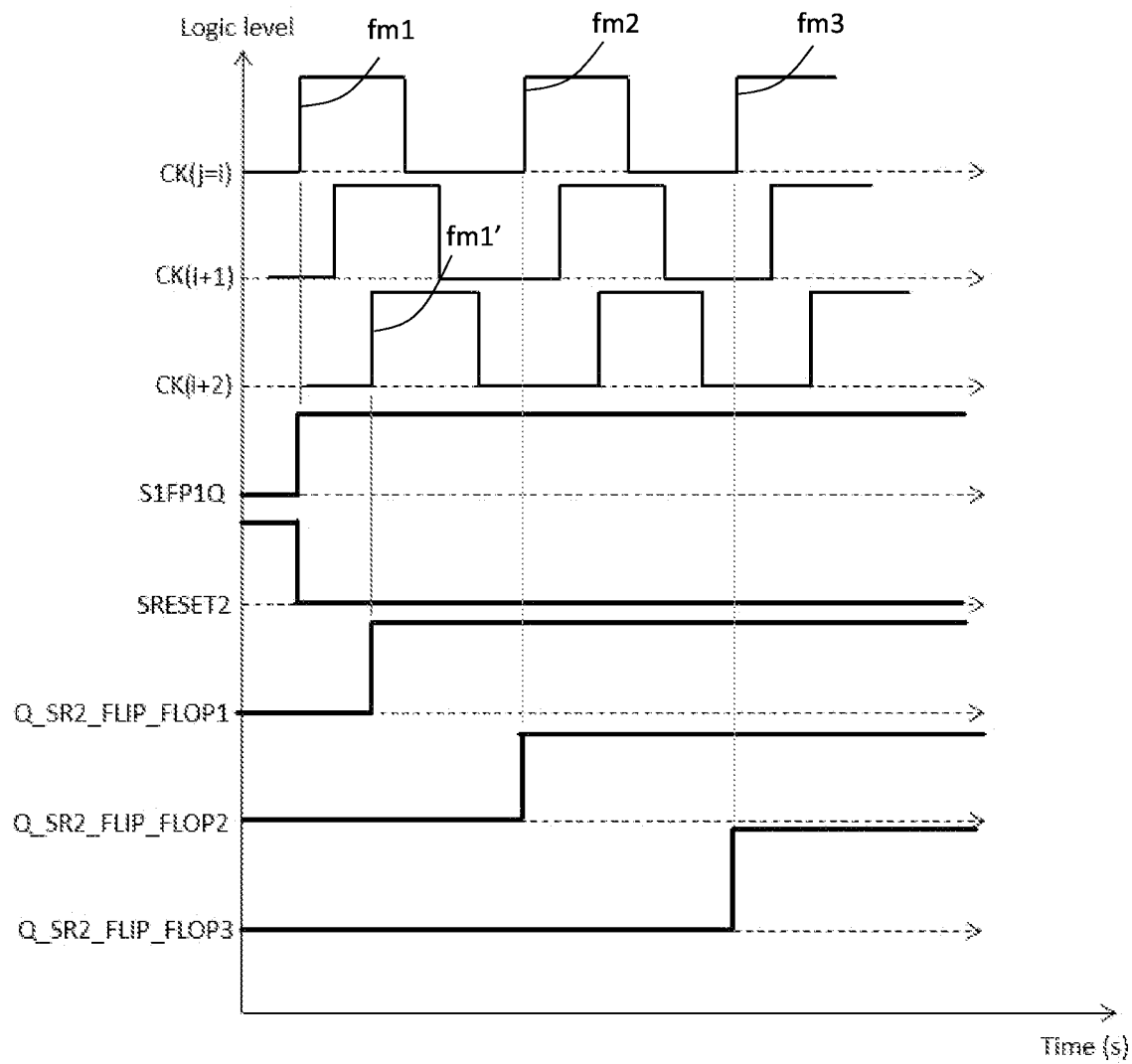
FIG. 5a is a timing diagram showing signals of FIG. 4 according to an embodiment of the present disclosure.
Figure 5B:
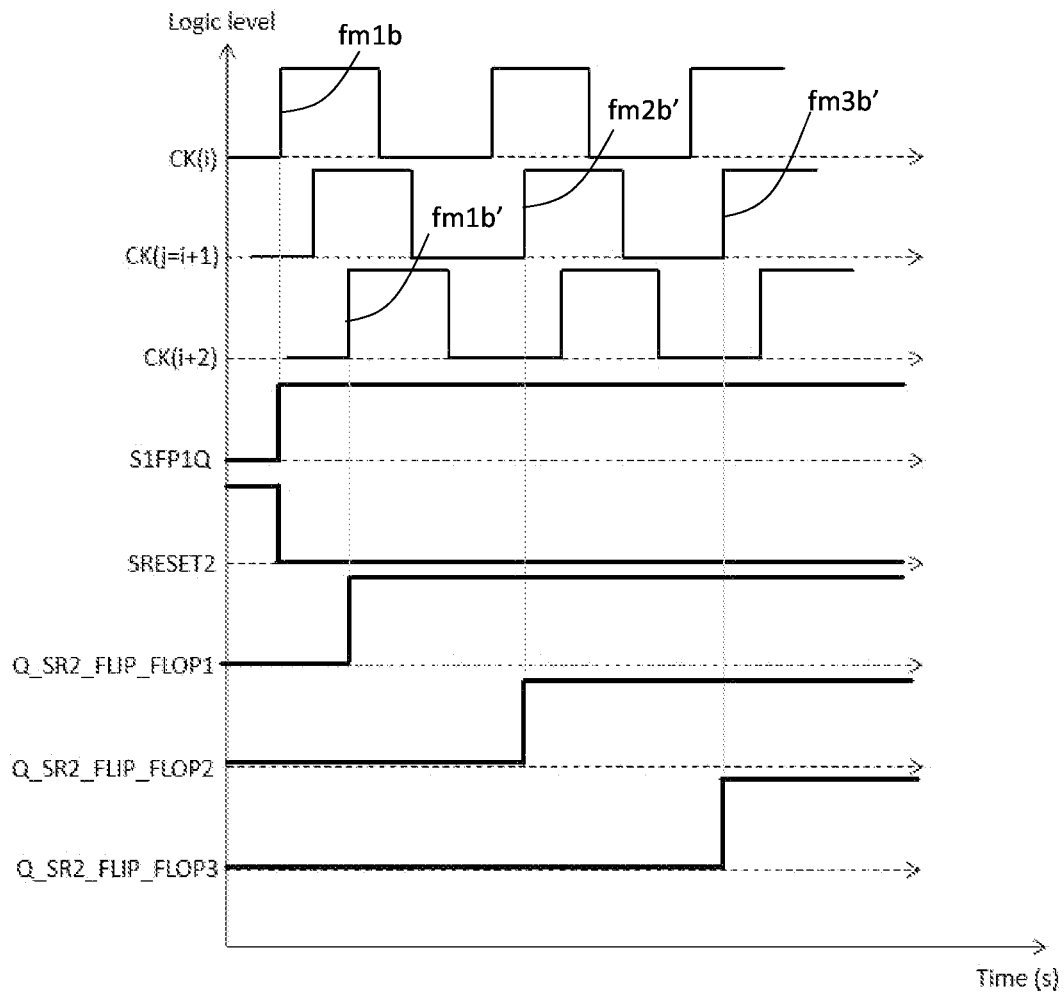
FIG. 5b is a timing diagram showing signals of FIG. 4 according to another embodiment of the present disclosure.
Figure 5C:
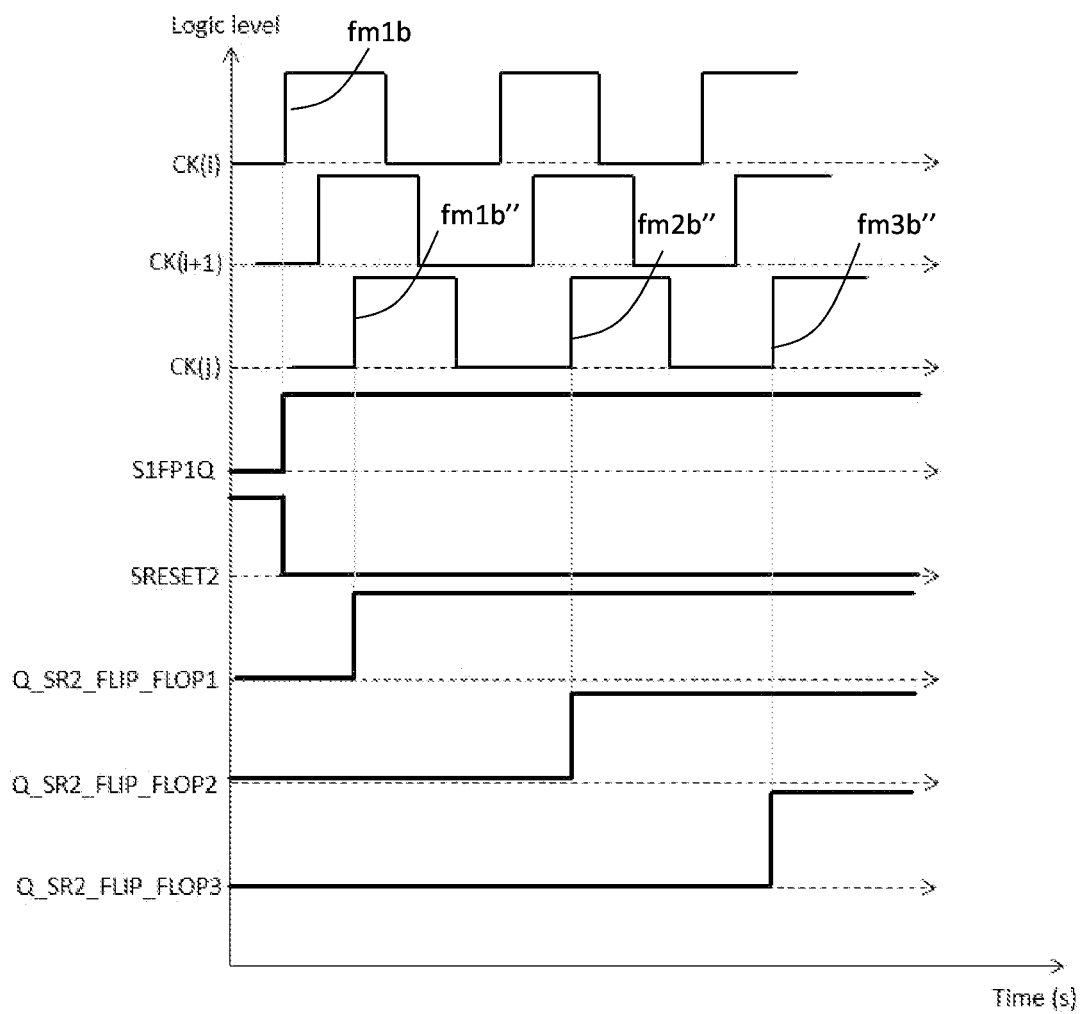
FIG. 5c is a timing diagram showing signals of FIG. 4 according to an embodiment of the present disclosure.

FIGS. 5a, 5b, and 5c are timing diagrams showing signals of FIG. 4 according to an embodiment of the present disclosure.

FIG. 5a shows the case where j=1, that is, multiplexers 104 and 410 are controlled to select the same clock signal from among signals SCK1 to SCKN. In this case, multiplexer 408 is controlled to select clock CK(i+2). The signal S1FP1Q at the output of first shift register 110 thus has a rising edge, and signal SRESET2 has a falling edge, just after a rising edge fm1 of clock signal CK(j=i). Signal Q_SR2_FLIP_FLOP1 has a rising edge just after a rising edge fm1' of clock signal CK(i+2) which follows rising edge fm1. Signals Q_SR2_FLIP_FLOP2 and Q_SR2_FLIP_FLOP3, however, have rising edges just after corresponding rising edges fm2 and fm3 of clock signal CK(i=j).

FIG. 5b shows the case where j=i+1. In this case, multiplexer 408 is controlled to select clock CK(i+2). The signal S1FP1Q at the output of first shift register 110 thus has a rising edge, and signal SRESET2 has a falling edge, just after a rising edge fm1b of clock signal CK(i). Signal Q_SR2_FLIP_FLOP1 has a rising edge just after a rising edge fm1b' of clock signal CK(i+2) which follows rising edge fmib. Signals Q_SR2_FLIP_FLOP2 and Q_SR2_FLIP_FLOP3, however, have rising edges just after corresponding rising edges fm2b' and fm3b' of clock signal CK(j=i+1).

FIG. 5c shows the case where j is different from i and from i+1. In this case, multiplexer 408 is controlled to select clock CK(j). The signal S1FP1Q at the output of first shift register 110 thus has a rising edge, and signal SRESET2 has a falling edge, just after a rising edge fm1b of clock signal CK(i). Signals Q_SR2_FLIP_FLOP1, Q_SR2_FLIP_FLOP2 and Q_SR2_FLIP_FLOP3 thus have rising edges just after corresponding rising edges fm1b", fm2b", and fm3b" of clock signal CK(j).

Figure 6:
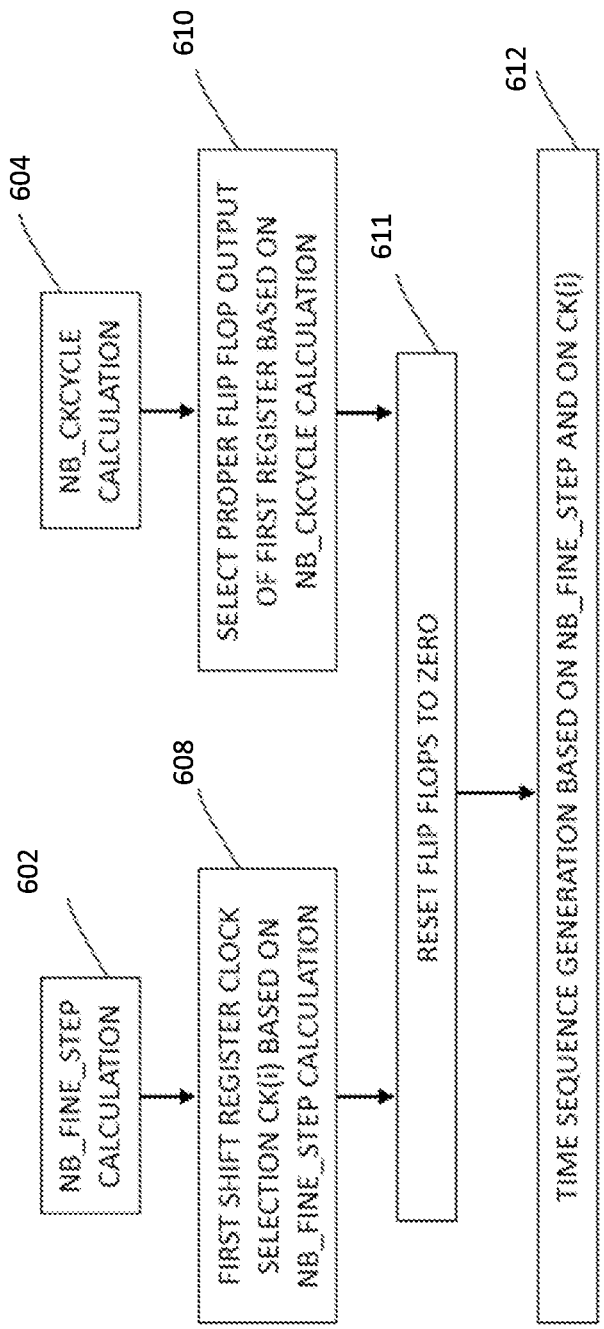
FIG. 6 shows a method of timing sequence edge generation with the circuit of FIG. 1, according to an embodiment of the present disclosure.

FIG. 6 shows a method of generation of an edge of a timing sequence with the circuit of FIG. 1, according to an embodiment of the present disclosure. At a step 602 (NB_FINE_STEP CALCULATION), parameter NB_FINE_STEP is calculated as explained for the example of FIG. 1. At another step 604 (NB_CKCYCLE CALCULATION), parameter NB_CKCYCLE is calculated as explained for the example of FIG. 1.

In certain cases, steps 602 and 604 are carried out prior to the method of FIG. 6, and only the selection signals of the multiplexers are recorded in control circuit CMD.

At a step 608 (FIRST SHIFT REGISTER CLOCK SELECTION CK(i) BASED ON NB_FINE_STEP CALCULATION) carried out after step 606, multiplexer 104 is controlled to select the clock signal as indicated in the example of FIG. 1. At a step 610 (SELECT PROPER FLIP FLOP OUTPUT OF FIRST REGISTER BASED ON NB_CKCYCLE CALCULATION), carried out after step 606, multiplexer 120 is controlled to select a flip-flop output of first shift register 110 as indicated in the example of FIG. 1. At a step 611 (RESET FLIP FLOPS TO ZERO), the R input of the flip-flops of first shift register 110 is activated to reset the flip-flops.

At a step 612 (TIME SEQUENCE GENERATION BASED ON NB_FINE_STEP AND ON CK(i)), the timing sequence having an edge is generated from the clock signal selected at step 608 by multiplexer 104, and from the output signal of the flip-flop selected at step 610.

Figure 7:
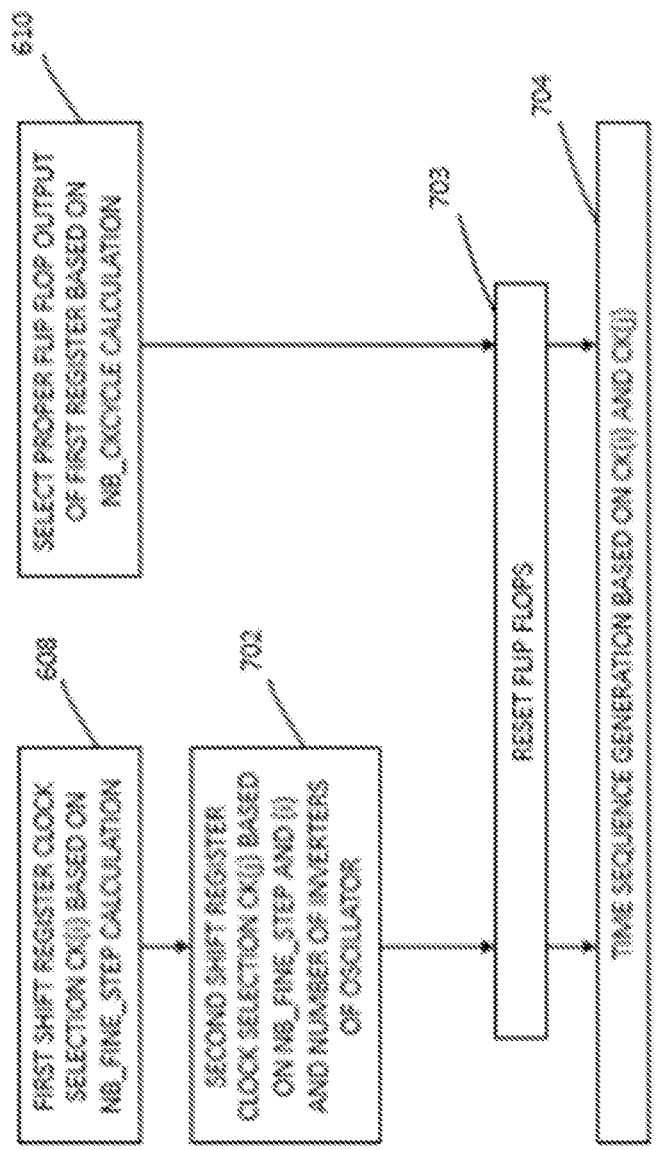
FIG. 7 shows a method of timing sequence edge generation with the circuit of FIG. 4, according to an embodiment of the present disclosure.

FIG. 7 shows a method of generation of an edge of a timing sequence with the circuit of FIG. 4, according to an embodiment of the present disclosure. In the example of FIG. 7, steps 608 and 610 are identical to those of FIG. 6.

At a step 702 (SECOND SHIFT REGISTER CLOCK SELECTION CK(j) BASED ON NB_FINE_STEP AND (i) AND NUMBER OF INVERTERS OF OSCILLATOR), clock signal (j) is selected as explained in the example of FIG. 4. At a step 703 (RESET FLIP FLOPS), the flip-flops are for example reconfigured as explained in the example of FIG. 4. At a step 704 (TIME SEQUENCE GENERATION BASED ON CK(i) AND CK(j)), the timing sequence having two edges is generated from clock signals CK(i) and CK(j) as explained in the example of FIG. 4.

Figure 8:
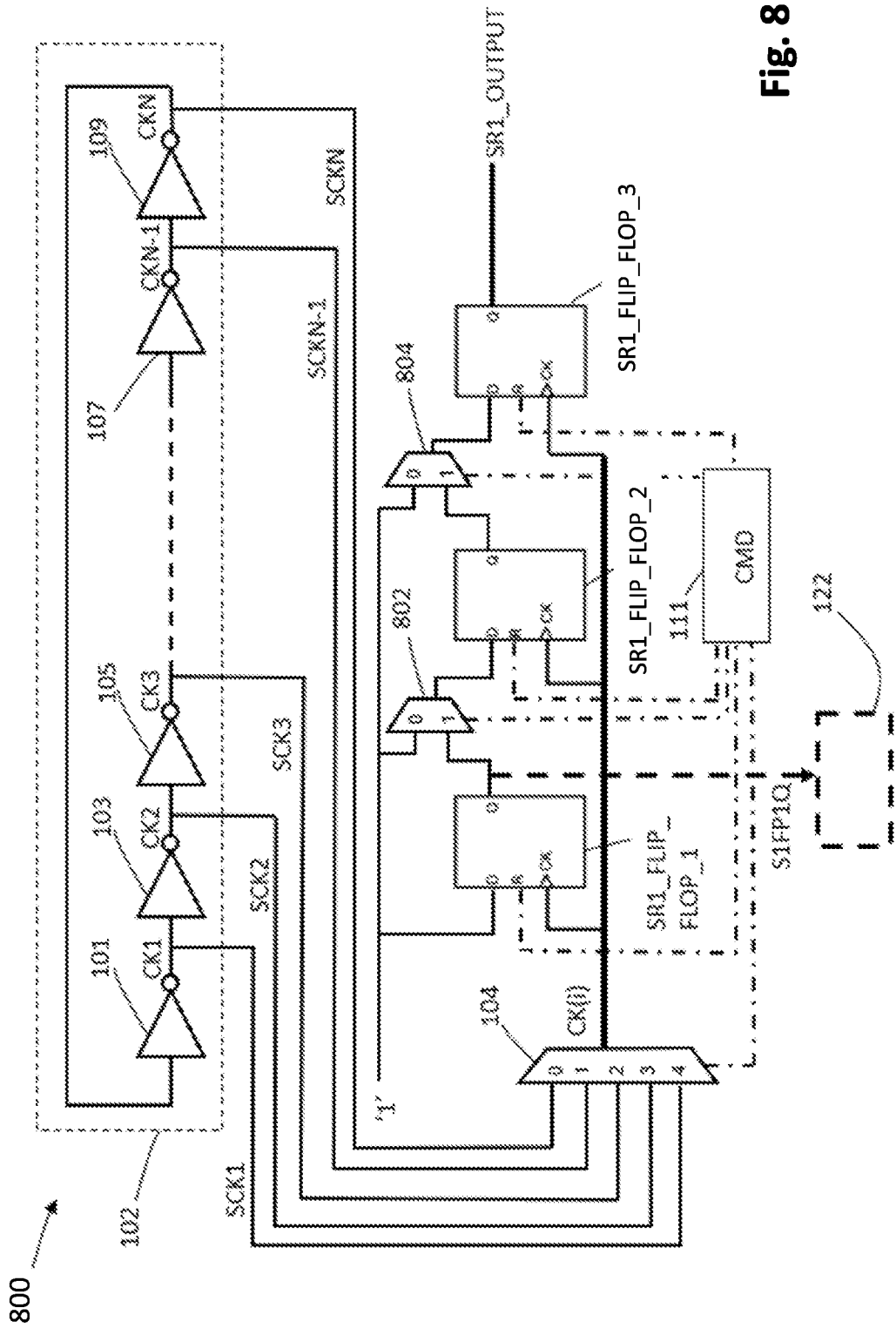
FIG. 8 schematically shows a timing sequence edge generation circuit according to another embodiment of the present disclosure.

FIG. 8 schematically shows a circuit 800 of generation of an edge of a timing sequence according to another embodiment of the present disclosure. Circuit 800 is similar to the circuit of FIG. 1 except for selection device 120, which is replaced by selection devices 802 and 804 in the example of FIG. 8, and flip-flops SR1_FLIP_FLOP_1, SR1_FLIP_FLOP_2, and SR1_FLIP_FLOP_3 are not connected together in the same way between FIG. 1 and FIG. 8.

In the example of FIG. 8, selection device 802, which is for example a two-input multiplexer, has one of its inputs, noted "0" which is coupled to a state '1', which for example corresponds to a high voltage level. Selection device 802 has another input, noted "1", which is coupled, for example, to the Q output of flip-flop SR1_FLIP_FLOP_1. The output of selection device 802 is coupled to the D input of flip-flop SR1_FLIP_FLOP_2. Selection device 802 is controlled, for example, by control unit 111.

In the example of FIG. 8, a selection device 804, which is, for example, a two-input multiplexer, has one of its inputs, noted "0", which is coupled to a state '1', which is for example a high state. Selection device 804 has another input, noted "1", which is coupled, for example, to the Q output of flip-flop SR1_FLIP_FLOP_2. The output of selection device 804 is coupled to the D input of flip-flop SR1_FLIP_FLOP_3. Selection device 804 is controlled, for example, by control unit 111.

In an example, not illustrated, a buffer is, for example, arranged in series between the Q output of flip-flop SR1_FLIP_FLOP_1 and input '1' of selection device 802 and/or another buffer is for example arranged in series between the Q output of flip-flop SR1_FLIP_FLOP_2 and input "1" of selection device 804.

The general operation of the circuit of the example of FIG. 8 is similar to that of FIG. 1.

In the example of FIG. 8, the placing of selection devices 802 and 804 enables the determination of the effective size of the shift register more optimally in terms of timing accuracy for the desired sequence. The critical path which ideally tends towards a zero propagation delay starts as soon as the output of the ring oscillator from the rising (or falling according to the implementation of the flip-flops) edge and ends on the rising edge of signal SR1_OUTPUT. In the case of the implementation of FIG. 8, the signal just has to cross clock multiplexer 104, as well as output flip-flop SR1_FLIP_FLOP_3. There thus are 2 elements on this critical path, which enables to limit additional and unwanted delays and uncertainties.

In an example of operation, not illustrated, of the circuit of FIG. 8, the method of FIG. 7 may be applied to circuit 800. In this case, step 703 becomes identical to step 611.

Various embodiments and variants have been described. Those skilled in the art will understand that certain features of these various embodiments and variants may be combined, and other variants will occur to those skilled in the art. In particular, the signals generated in the example of FIG. 1 or in the example of FIG. 4 may be recombined with logic gates to construct more complex signals. Those skilled in the art may further implement a step of oscillator resetting at the beginning of the generation of the timing sequence.

Those skilled in the art will be capable of adapting the type of D flip-flop according to the circuit. For example, the inverters of secondary circuit 122 are omitted in the case where D flip-flops with a low active reset signal are used to implement flip-flops SR2_FLIP_FLOP_1, SR2_FLIP_FLOP_2, and SR2_FLIP_FLOP_3. In another example, scanning D flip-flops are used to implement flip-flops SR2_FLIP_FLOP_1, SR2_FLIP_FLOP_2, and SR2_FLIP_FLOP_3, with the scanning function deactivated. In still another example, reset flip-flops with a high level and with a reset state which is high "1" for the Q output may be used. In this case, those skilled in the art may use the $\overline{Q}$ output if it is available or insert an inverter after the Q output. In the case where flip-flops with a low active reset signal and with an output state having a high state "1" are used, the complementary of the output should be used or generated and the inverters of secondary circuit 122 should be removed.

In secondary circuit 122, those skilled in the art may couple signal S1FP1Q to the D input of flip-flop SR2_FLIP_FLOP1 instead of the R input.

Finally, the practical implementation of the described embodiments and variations is within the abilities of those skilled in the art based on the functional indications given hereabove.

What is claimed is:
1. A timing sequence generation circuit comprising:
a ring oscillator having a plurality of clock signal outputs configured to provide clock signals delayed in time with respect to one another;

a first shift register comprising a flip-flop having a clock input coupled to a clock signal input of the first shift register and an output coupled to an output of the first shift register;
a first circuit configured to:
  select a clock signal from among the clock signals; and
  deliver the selected clock signal to the clock signal input of the first shift register; and
a second shift register comprising a plurality of flip-flops, wherein:
  a first clock signal selected from among the clocks signals is configured to be coupled to a clock input of a first flip-flop of the plurality of flip-flops of the second shift register,
  a second clock signal selected from among the clocks signals is configured to be coupled to a clock input of a second flip-flop of the plurality of flip-flops of the second shift register,
  the second clock signal is different from the first clock signal, and
  the first flip-flop is different from the second flip-flop.

2. The circuit according to claim 1, further comprising a second circuit configured to select the output of the flip-flop.

3. The circuit according to claim 1, wherein the flip-flop is a D-type flip-flop.

4. The circuit according to claim 1, wherein the first clock signal is different from the selected clock signal.

5. The circuit according to claim 1, wherein a data input of the first flip-flop of the second shift register is configured to receive an output signal at the output of the flip-flop of the first shift register.

6. The circuit according to claim 1, wherein a reset input of the first flip-flop of the second shift register is coupled to the output of the first shift register.

7. The circuit according to claim 6, further comprising:
a multiplexer having an output coupled to a data input of the first flip-flop of the plurality of flip-flops of the second shift register, the multiplexer configured to select from among a signal corresponding to a high level or an output signal of one of a further flip-flop of the plurality of flip-flops of the second shift register.

8. The circuit according to claim 1, wherein the first shift register further comprises:
a first selection circuit having a first input coupled to the output of the flip-flop of the first shift register and a second input coupled to a power supply rail, the first selection circuit configured to couple a selected one of the first input and the second input to an input of a second flip-flop of the first shift register; and
a second selection circuit having a third input coupled to the output of the second flip-flop of the first shift register and a fourth input coupled to the power supply rail, the second selection circuit configured to couple a selected one of the third input and the fourth input to an input of a third flip-flop of the first shift register.

9. The circuit according to claim 1, wherein the ring oscillator comprises an odd-number of logic gates coupled in series and configured to produce the clock signals.

10. A method of generating a timing sequence using a circuit comprising a ring oscillator having a plurality of clock signal outputs configured to provide clock signals delayed in time with respect to one another, a first shift register, and a second shift register comprising a plurality of flip-flops, the method comprising:
selecting a clock signal from among the clock signals;
delivering the selected clock signal to a clock signal input of the first shift register;
selecting a first clock signal of the clock signals;
selecting a second clock signal of the clock signals different from the first clock signal;
providing the selected first clock signal to a clock input of a first flip-flop of the plurality of flip-flops of the second shift register; and
providing the selected second clock signal to a clock input of a second flip-flop of the plurality of flip-flops of the second shift register different from the first flip-flop.

11. The method according to claim 10, further comprising selecting an output of one of a plurality of flip-flops of the first shift register.

12. The method according to claim 10, wherein a reset input of a flip-flop of the second shift register is coupled to an input signal of a flip-flip of the first shift register.

13. The method according to claim 12, further comprising:
selecting a signal from a high-level signal and an output signal from the first flip-flop of the plurality of flip-flops of the second shift register; and
providing the selected signal to a data input of the second flip-flop of the plurality of flip-flops.

14. The method according to claim 10, further comprising receiving, by a data input of a flip-flop of the second shift register, an output signal of a flip-flop of the first shift register.

15. The method according to claim 10, wherein:
the first shift register comprises a plurality of flip-flops; and
the method further comprises:
selecting a first signal from among an output signal of a first flip-flop of the plurality of flip-flops of the first shift register and a power supply voltage,
providing the selected first signal to an input of a second flip-flop of the plurality of flip-flops of the first shift register,
selecting a second signal from among an output signal of the second flip-flop of the of the plurality of flip-flops of the first shift register and the power supply voltage, and
providing the selected first signal to an input of a third flip-flop of the plurality of flip-flops of the first shift register.

16. The method according to claim 10, wherein the first clock signal is different from the selected clock signal.

17. A timing sequence generation circuit comprising:
a ring oscillator comprising a plurality of clock outputs corresponding to different phases of the ring oscillator;
a first multiplexer having inputs coupled to the plurality of clock outputs;
a first shift register having a clock input coupled to an output out of the first multiplexer;
a second multiplexer having inputs coupled to outputs of a plurality of registers of the first shift register and an output configured to provide a first timing sequence; and
a second shift register comprising a first register having a reset input coupled to an output of one of the plurality of registers of the first shift register.

18. The timing sequence generation circuit of claim 17, further comprising:
a third multiplexer having inputs coupled to the plurality of clock outputs, wherein the second shift register further comprises and a clock input coupled to an output of the third multiplexer.

19. The timing sequence generation circuit of claim 17, further comprising:
a fourth multiplexer having a first input configured to receive a first logic signal, a second input coupled to an output of the first register, and an output coupled to a second register of the second shift register.

20. The timing sequence generation circuit of claim 19, further comprising:
a fifth multiplexer having a first input coupled to the reset input of the second shift register, a second input coupled to the output of the first register of the second shift register, and an output coupled to an input of the second register of the second shift register.

21. The timing sequence generation circuit of claim 18, wherein the first register of the second shift register is a D-type flip-flop.

\* \* \* \* \*